United States Patent
Arnold et al.

(10) Patent No.: US 6,933,532 B2
(45) Date of Patent: Aug. 23, 2005

(54) OLED DISPLAY WITH PHOTOSENSOR

(75) Inventors: Andrew D. Arnold, Hilton, NY (US); Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/401,658

(22) Filed: Mar. 28, 2003

(65) Prior Publication Data

US 2004/0188687 A1 Sep. 30, 2004

(51) Int. Cl.$^7$ .................... H01L 27/15; H01L 31/12; H01L 33/00
(52) U.S. Cl. ........................... 257/80; 257/291
(58) Field of Search ..................... 257/57, 59, 72, 257/79, 80, 81, 82, 83, 84, 95, 98, 99, 290, 291, 53, 60

(56) References Cited

U.S. PATENT DOCUMENTS

| | | | | |
|---|---|---|---|---|
| 3,728,594 A | * | 4/1973 | Yim et al. | 257/43 |
| 5,371,537 A | | 12/1994 | Bohan et al. | |
| 6,489,631 B2 | | 12/2002 | Young et al. | |
| 6,559,595 B1 | * | 5/2003 | Inoue | 313/506 |
| 2004/0001202 A1 | * | 1/2004 | Seo et al. | 257/79 |

* cited by examiner

*Primary Examiner*—Douglas Wille
*Assistant Examiner*—Dana Farahani
(74) *Attorney, Agent, or Firm*—Andrew J. Anderson; Thomas H. Close

(57) ABSTRACT

An OLED display including: a transparent electrode; a reflective electrode having a transparent window; a light emissive layer disposed between the transparent electrode and the reflective electrode; and a photosensor located under the transparent window of the reflective electrode to sense light produced by the light emissive layer.

25 Claims, 2 Drawing Sheets

OLED DISPLAY WITH PHOTOSENSOR

FIELD OF THE INVENTION

The present invention relates to solid-state OLED flat-panel displays and more particularly to such displays having photosensors integrated into the display.

BACKGROUND OF THE INVENTION

Solid-state organic light emitting diode (OLED) image displays are of great interest as a superior flat-panel display technology. These displays utilize current passing through thin films of organic material to generate light. The color of light emitted and the efficiency of the energy conversion from current to light are determined by the composition of the organic thin-film material. Different organic materials emit different colors of light. However, as the display is used, the organic materials in the device age and become less efficient at emitting light. It is useful, therefore, to provide a means to correct the light output of an OLED device over time.

OLED devices are conventionally either top-emitting or bottom-emitting. An OLED display is constructed upon a substrate by depositing an electrode upon the substrate, organic light emitting materials over the first electrode, and a second electrode above the light emitting materials. A cover is used to encapsulate and protect the device. Light is emitted by the application of a current from one electrode to another passing through the organic light emitting materials. A bottom emitting device emits light through the substrate and first electrode which must both be transparent. The second electrode may be either transparent or reflective. A top-emitting device emits light through the cover and second electrode which must both be transparent. In this case, the second electrode may be either transparent or reflective.

OLED devices emit light in every direction. A portion of the light is emitted directly toward the front of the display device: through the substrate (for a bottom emitter device) or the encapsulating cover (for a top emitter device). A similar portion of the light is emitted toward the back of the display device and may be either absorbed or reflected by the electrode or other layers behind the organic layers. If the portion of light emitted toward the back is reflected, it can pass through the organic layers again and be emitted through the front of the display, thereby increasing the brightness of the display. If the portion of the light emitted toward the back is absorbed, it is absorbed and lost, thereby reducing the light emitted by one half.

Because OLED materials age, it is known to calibrate OLED display devices through the use of external sensors which measure the light output from the display device and construct a calibration table for use by the device to correct for aging. See for example U.S. Pat. No. 5,371,537, issued Dec. 6, 1994 to Bohan et al. This approach has the problem that the sensor device obscures the display during the calibration and is not capable of providing real time operation. Moreover, these approaches are not useful for correcting uniformity variations among individual pixel display elements.

Alternative methods utilize a light sensor integrated with the light emitting elements of the display themselves. For example, U.S. Pat. No. 6,489,631, issued Dec. 3, 2002, to Young et al. describes the integration of a photosensitive device with an electro-luminescent pixel element. The light sensing elements each comprise a gated photosensitive thin-film device such as a TFT structure having a semiconductor layer with contact regions laterally spaced on the substrate and separated by a gate controlled region. A part of the associated display element extends over the gate controlled region with an electrode of the display element serving as the gate of the photosensitive device, thereby ensuring good optical coupling between the display element and the photosensitive device. This arrangement requires the use of a transparent electrode and therefore fails to optimize emission of the light produced by the display element and limits the power that can be passed through the electrode.

There is a need therefore for an improved OLED display having integrated photosensors.

SUMMARY OF THE INVENTION

The need is met according to the present invention by providing an OLED display that includes: a transparent electrode; a reflective electrode having a transparent window; a light emissive layer disposed between the transparent electrode and the reflective electrode; and a photosensor located under the transparent window of the reflective electrode to sense light produced by the light emissive layer.

ADVANTAGES

The advantages of this invention are an OLED display device that provides a means to measure the light output of the OLED display device while maximizing the light output.

DETAILED DESCRIPTION OF THE INVENTION

Figure 2:
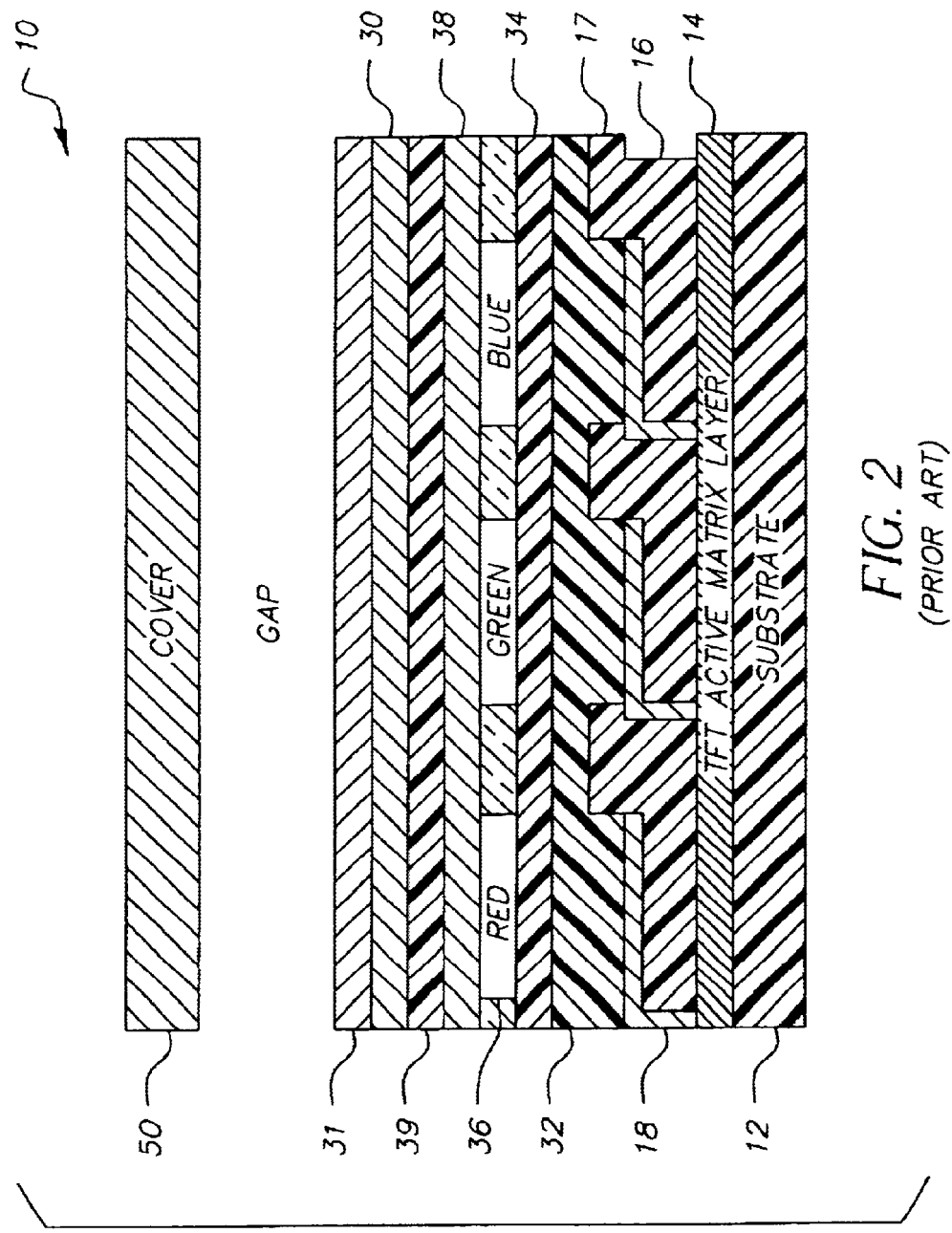
FIG. 2 is a cross sectional schematic diagram of a portion of a prior art top-emitting OLED display.

Referring to FIG. 2, a prior art top-emitting OLED display device 10 is shown with a substrate 12, and a thin-film transistor (TFT) active matrix layer 14 comprising an array of TFTs that provides power to OLED elements. A patterned first insulating layer 16 is provided over the TFT active matrix layer 14, and an array of reflective electrodes 18 are provided over insulating layer 16 and in electrical contact with the TFT active matrix layer 14. A patterned second insulating layer 17 is provided over the array of reflective electrodes 18 such that at least a portion of the each of the reflective electrodes 18 is exposed.

Over the first electrodes and insulating layers are provided red, green, and blue-emitting organic electroluminescent (EL) elements 19. Herein, the collection of organic EL elements may also be referred to as the organic EL layer. This layer may be made up of other layers as is known in the art, for example a hole-injection layer 32, hole-transport layer 34, emissive layer 36, electron-transport layer 38, and electron injection layer 39. Alternatively, a single continuous white emitting layer may be used with an array of color filters in the place of separate red, green and blue light emitting elements.

The light-emitting pixel area is generally defined by the area of the first electrode 18 in contact with the organic EL elements. Over the organic EL layer is provided a transparent, common transparent electrode 30 that has sufficient optical transparency to allow transmission of the generated red, green, and blue light. Each first electrode in combination with its associated organic EL element and second electrode is herein referred to as an OLED element. A typical top-emitting OLED display device comprises an array of OLED elements wherein each OLED element emits red, green or blue. However, monochrome display devices are also known where the array of OLED elements emit the same color light, for example, white. An encapsulating or protective layer 31 may be provided over the transparent electrode 30.

In operation, the thin-film transistors in TFT layer 14 allow current to flow between the first electrode 18, each of which can be selectively addressed, and the common second electrode 30. Holes and electrons recombine within the organic EL elements to emit light.

Figure 1A:
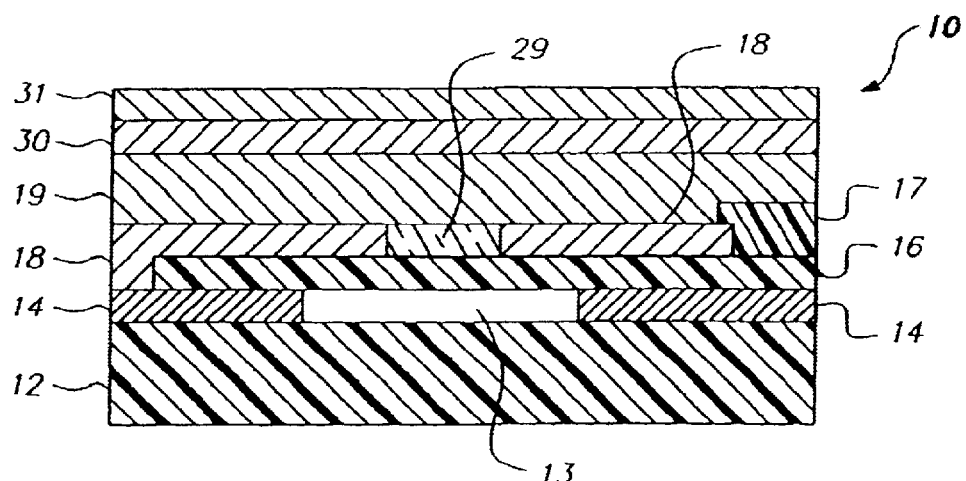
FIG. 1 is a cross sectional schematic diagram of a light emitting element in an OLED display according to the present invention.
Figure 1B:
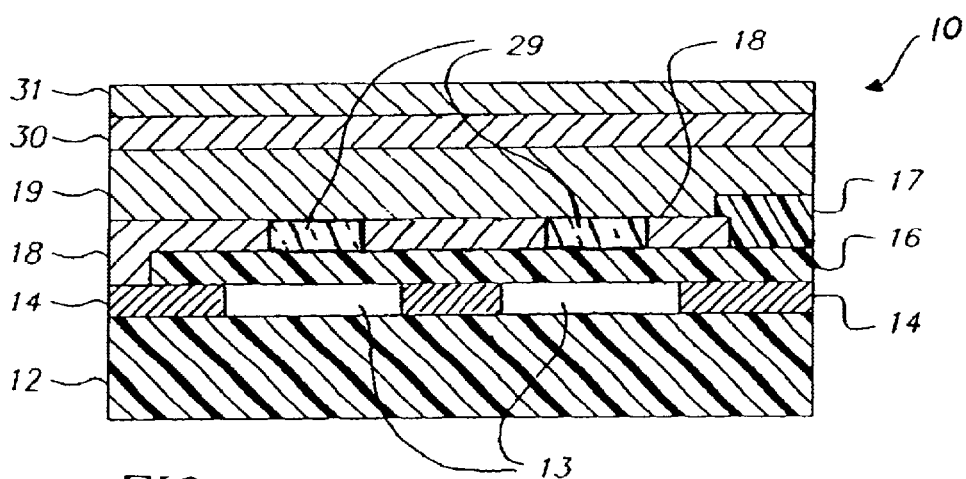

Referring to FIG. 1, according to one embodiment of the present invention, a photosensor 13 is located beneath the first electrode 18 and first insulating layer 16. The first insulating layer 16 is transparent and may be composed, for example, of silicon dioxide. First electrode 18 is reflective to maximize light output from the device. A transparent window 29 is provided within the first electrode 18 to allow light to pass through the opening and the transparent first insulating layer 16 to the photosensor 13. Generally, the transparent window 29 is less than half the size of the first electrode 18 and preferably smaller. Suitable electrode materials are known in the art and may include, for example, silver, aluminum, or compounds of silver and aluminum.

In operation, light is emitted by the organic materials located above the first electrode 18. Although light may not be emitted from the electroluminescent elements 19 directly above the transparent window 29, light is emitted in every direction from the areas above the first electrode 18. Some of this light will pass through the transparent window 29 to the photosensitive device 13. The light can then be measured and used by the display, for example, to calibrate or control the light output of the light emitting element using means known in the art and referred to in this disclosure. Because the transparent window 29 is much smaller than the first electrode 18, the reduction in light output from the area above the transparent window 29 is small compared to the light output achieved by the use of a reflective first electrode 18. Because the first electrode is reflective and can be very thick, it can carry larger amounts of current than if it was constrained to be transparent. Moreover, a wider variety of materials may be used for the first electrode 18, easing the manufacturing process.

The transparent window 29 can be patterned at the same time the first electrode 18 is created so that no further photolithography steps are necessary to create the opening. The window may be filled in with an insulating, transparent material, such as silicon dioxide, and preferably comprises the same material and is deposited at the same time as the second insulating layer 17. Alternatively, the organic materials 19 may be deposited directly over the window 29 with no intervening material deposited, simplifying the masking of the second insulating layer 17. In yet another alternative, a thin transparent electrode (for example, a thin metal layer made of silver or aluminum, or compounds of silver or aluminum, or a thin layer of ITO) may be provided in the transparent window 29. The thin transparent electrode may cover the entire electrode 18 or only the transparent window 29. This enhances light output and optical coupling to the photosensor 13 without significantly compromising the reflectivity and light output of the display.

The size of the transparent window 29 may be adjusted to suit the sensitivity of the photosensor 13, the efficiency of the light emitting elements, and the noise requirements of the display circuitry. Alternatively, if a semi-transparent opening is provided, for example with a thin conductive metal layer, the thickness (and conductivity) of the window 29 may be adjusted to optimize the light output and the photosensitive signal.

One photosensor 13 may be provided per light emitting element and the light emitting elements being deposited in a rectangular arrangement over the display. Alternatively, multiple photosensor 13 and transparent openings 29 may be provided, especially for large light emitting elements.

In a preferred embodiment, the invention is employed in a device that includes Organic Light Emitting Diodes (OLEDs) which are composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light emitting displays can be used to fabricate such a device.

General Device Architecture

The present invention can be employed in most OLED device configurations. These include very simple structures comprising a single anode and cathode to more complex devices, such as passive matrix displays comprised of orthogonal arrays of anodes and cathodes to form light emitting elements, and active-matrix displays where each light emitting element is controlled independently, for example, with thin film transistors (TFTs).

Figure 3:
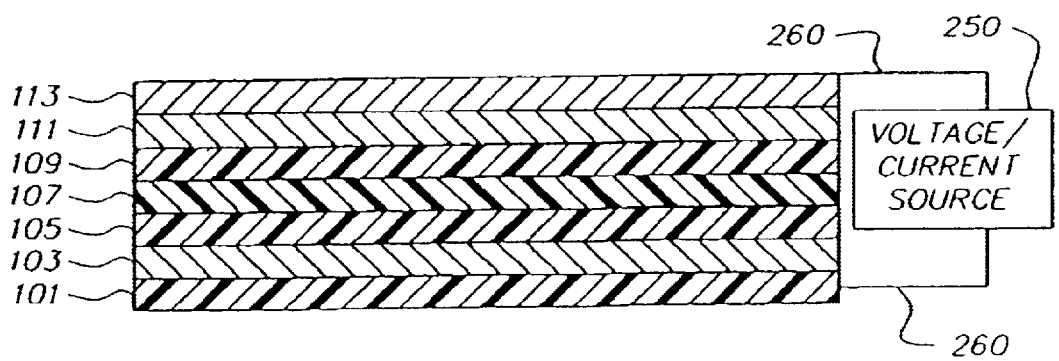
FIG. 3 is a schematic diagram of a prior art OLED structure.

There are numerous configurations of the organic layers wherein the present invention can be successfully practiced. A typical prior art structure is shown in FIG. 3 and is comprised of a substrate 101, an anode 103, a hole-injecting layer 105, a hole-transporting layer 107, a light-emitting layer 109, an electron-transporting layer 111, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. The total combined thickness of the organic layers is preferably less than 500 nm.

The anode and cathode of the OLED are connected to a voltage/current source 250 through electrical conductors 260. The OLED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the OLED is operated in an AC mode where, for some time period in the cycle, the potential bias is reversed and no current flows. An example of an AC-driven OLED is described in U.S. Pat. No. 5,552,678.

Substrate

The OLED device of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can either be transmissive or opaque. In the case wherein the substrate is transmissive, a reflective or light absorbing layer is used to reflect the light through the cover or to absorb the light, thereby improving the contrast of the display. Substrates can include, but are not limited to, glass, plastic, semiconductor materials, silicon, ceramics, and circuit board materials. Of course it is necessary to provide a light-transparent top electrode.

Anode

When EL emission is viewed through anode 103, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injecting Layer (HIL)

While not always necessary, it is often useful to provide a hole-injecting layer 105 between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl) phenylamino]triphenylamine). Alternative hole-injecting materials reportedly useful in organic EL devices are described in EP 0 891 121 A1 and EP 1 029 909 A1.

Hole-Transporting Layer (HTL)

The hole-transporting layer 107 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino] naphthalene
N,N,N',N'-Tetra(2-naphthyl)-4,4"-diamino-p-terphenyl
4,4'-Bis{N-phenyl-N-[4-(1-naphthyl)-phenyl] amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino] triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV)

can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine[alias, tris(8-quinolinolato) aluminum(III)]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-□-oxo-bis(2-methyl-8-quinolinolato) aluminum(III)

CO-5: Indium trisoxine[alias, tris(8-quinolinolato) indium]

CO-6: Aluminum tris(5-methyloxine)[alias, tris(5-methyl-8-quinolinolato)aluminum(III)]

CO-7: Lithium oxine[alias, (8-quinolinolato)lithium(I)]

CO-8: Gallium oxine[alias, tris(8-quinolinolato)gallium (III)]

CO-9: Zirconium oxine [alias, tetra(8-quinolinolato) zirconium(IV)]

Other classes of useful host materials include, but are not limited to: derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2',2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis (azinyl)methane compounds, and carbostyryl compounds.

Electron-Transporting Layer (ETL)

Preferred thin film-forming materials for use in forming the electron-transporting layer 111 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

Cathode

When light emission is viewed solely through the anode, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608, 287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,393. Cathode materials are typically deposited by evaporation, sputtering, or chemical vapor deposition. When needed, patterning can be achieved through many well known methods including, but not limited to, through-mask deposition, integral shadow masking, for example, as described in U.S. Pat. No. 5,276, 380 and EP 0 732 868, laser ablation, and selective chemical vapor deposition.

Other Common Organic Layers and Device Architecture

In some instances, layers 109 and 111 can optionally be collapsed into a single layer that serves the function of supporting both light emission and electron transportation. It also known in the art that emitting dopants may be added to the hole-transporting layer, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. No. 5,683,823, U.S. Pat. No. 5,503,910, U.S. Pat. No. 5,405,709, and U.S. Pat. No. 5,283,182.

Additional layers such as electron or hole-blocking layers as taught in the art may be employed in devices of this invention. Hole-blocking layers are commonly used to improve efficiency of phosphorescent emitter devices, for example, as in US 20020015859.

This invention may be used in so-called stacked device architecture, for example, as taught in U.S. Pat. No. 5,703, 436 and U.S. Pat. No. 6,337,492.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or an electrode protection layer beneath the cover.

The invention has been described in detail with particular reference to certain preferred embodiments thereof, but it will be understood that variations and modifications can be effected within the spirit and scope of the invention.

Parts List

10 OLED display
12 substrate
13 photosensor
14 TFT layer
16 first insulating layer
17 second insulating layer
18 reflective electrodes
19 electroluminescent elements
29 transparent window
30 transparent electrode
31 encapsulating layer
32 hole-injection layer
34 hole-transport layer
36 light emissive layer
38 electron-transport layer
39 electron injection layer
50 cover
101 substrate
103 anode
105 hole injecting layer
107 hole transporting layer
109 light emitting layer
111 electron-transporting layer
113 cathode
250 voltage/current source
260 electrical conductors

What is claimed is:

1. An OLED display, comprising:
   a) a transparent electrode;
   b) a reflective electrode having a transparent window;
   c) a light emissive layer disposed between the transparent electrode and the reflective electrode; and
   d) a photosensor located under the transparent window of the reflective electrode to sense light produced by the light emissive layer.

2. The display claimed in claim 1, wherein the transparent window is an opening in the reflective electrode.

3. The display claimed in claim 2, wherein the opening is filled with a transparent insulator.

4. The display claimed in claim 3, wherein the transparent insulator is $SiO_2$.

5. The display claimed in claim 2, wherein the opening is filled with transparent conductor.

6. The display claimed in claim 5, wherein the transparent conductor is ITO.

7. The display claimed in claim 1, wherein the transparent window is a thin region in the reflective electrode.

8. The display claimed in claim 1, wherein the photosensor is a thin film device.

9. The display claimed in claim 1, wherein the window is located in the center of the reflective electrode.

10. The display claimed in claim 1, wherein the window is located at an edge of the reflective electrode.

11. The display claimed in claim 1, wherein the reflective electrode includes a plurality of windows.

12. The display claimed in claim 11, further comprising a plurality of photosensors corresponding to the plurality of windows.

13. A method of making an OLED display, comprising the steps of:
   a) providing a substrate;
   b) forming a control circuit, including a photosensor on the substrate;
   c) forming a reflective electrode having a transparent window located over the photosensor;
   d) depositing a light emissive layer over the reflective electrode; and
   e) forming a transparent electrode over the light emissive layer.

14. The method claimed in claim 13, wherein the transparent window is an opening in the reflective electrode.

15. The method claimed in claim 14, further comprising the step of providing a transparent insulator in the opening.

16. The method claimed in claim 15, wherein the transparent insulator is $SiO_2$.

17. The method claimed in claim 14, further comprising the step of providing a transparent conductor in the opening.

18. The method claimed in claim 17, wherein the transparent conductor is ITO.

19. The method claimed in claim 13, wherein the transparent window is a thin region in the reflective electrode.

20. The method claimed in claim 13, wherein the step of forming the photosensor employs a thin film manufacturing technique.

21. The method claimed in claim 13, wherein the window is located in the center of the reflective electrode.

22. The method claimed in claim 13, wherein the window is located at an edge of the reflective electrode.

23. The method claimed in claim 13, wherein the reflective electrode includes a plurality of windows.

24. The method claimed in claim 23, wherein the step of forming a photosensor includes forming a plurality of photosensors corresponding to the plurality of windows in the reflective electrode.

25. The method claimed in claim 14, wherein the display includes a plurality of light emitting elements defined by a plurality of separate reflective electrodes having openings, and further comprising the step of forming an insulator between the reflective electrodes and in the openings in the reflective electrodes.

* * * * *